(12) United States Patent
Eussen et al.

(10) Patent No.: US 7,474,409 B2
(45) Date of Patent: *Jan. 6, 2009

(54) LITHOGRAPHIC INTERFEROMETER SYSTEM WITH AN ABSOLUTE MEASUREMENT SUBSYSTEM AND DIFFERENTIAL MEASUREMENT SUBSYSTEM AND METHOD THEREOF

(75) Inventors: Emiel Jozef Melanie Eussen, Eindhoven (NL); Marcel Hendrikus Maria Beems, Veldhoven (NL); Engelbertus Antonius Fransiscus Van Der Pasch, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 268 days.

This patent is subject to a terminal disclaimer.

(21) Appl. No.: 10/995,545

(22) Filed: Nov. 24, 2004

(65) Prior Publication Data
US 2005/0248771 A1 Nov. 10, 2005

Related U.S. Application Data

(63) Continuation-in-part of application No. 10/720,752, filed on Nov. 25, 2003.

(51) Int. Cl.
*G01B 11/02* (2006.01)

(52) U.S. Cl. .................................................... 356/500

(58) Field of Classification Search ................. 356/486, 356/487, 493, 498, 500
See application file for complete search history.

(56) References Cited

U.S. PATENT DOCUMENTS

| | | | |
|---|---|---|---|
| 4,311,390 A | 1/1982 | Phillips | |
| 4,784,490 A | 11/1988 | Wayne | |
| 4,859,066 A * | 8/1989 | Sommargren | 356/487 |
| 5,151,749 A | 9/1992 | Tanimoto et al. | |
| 5,191,391 A | 3/1993 | Tsai | |
| 5,801,832 A * | 9/1998 | Van Den Brink | 356/500 |
| 6,020,964 A | 2/2000 | Loopstra et al. | |
| 6,384,899 B1 | 5/2002 | Den Boef | |
| 6,757,066 B2 | 6/2004 | Hill | |
| 6,806,962 B2 | 10/2004 | Hill | |
| 6,819,434 B2 * | 11/2004 | Hill | 356/500 |
| 2005/0111005 A1 | 5/2005 | Eussen et al. | |

FOREIGN PATENT DOCUMENTS

| | | |
|---|---|---|
| JP | 5-40011 A | 2/1993 |
| JP | 2004-138554 A | 5/2004 |
| JP | 2005-501240 A | 1/2005 |
| JP | 2005-525539 A | 8/2005 |

* cited by examiner

*Primary Examiner*—Samuel A Turner
(74) *Attorney, Agent, or Firm*—Sterne, Kessler, Goldstein & Fox P.L.L.C.

(57) ABSTRACT

An improved lithographic interferometer system, is presented herein. The lithographic interferometer system comprises a beam generating mechanism, mirrors which reflect those beams, and detection devices for detecting an interference pattern of overlapping reflected beams. The beam generating mechanism comprises a beam-splitter, which splits the beams into reference beams and measuring beams, a reference mirror that provides a plane mirror interferometer, and a reflective surface that emits at least one reference beam used in a differential plane mirror interferometer.

39 Claims, 5 Drawing Sheets

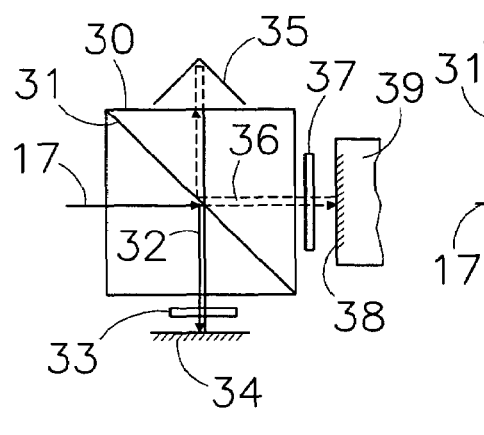
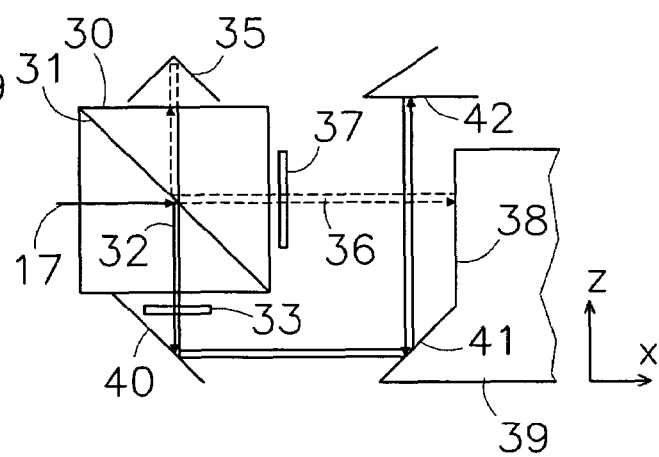
Fig 3a          Fig 3b
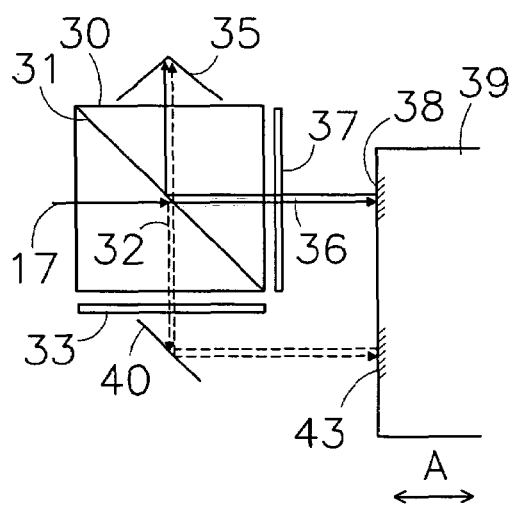
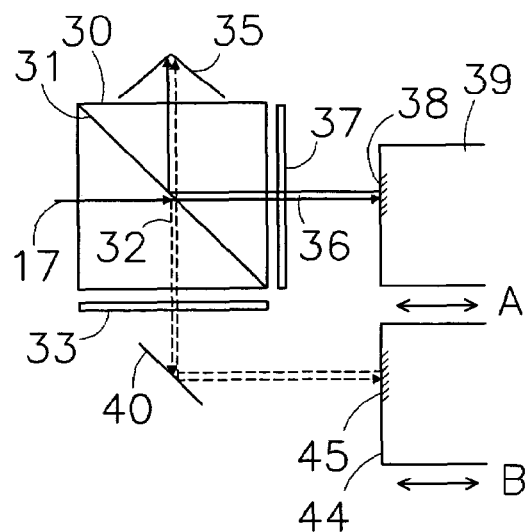
Fig 3c          Fig 3d

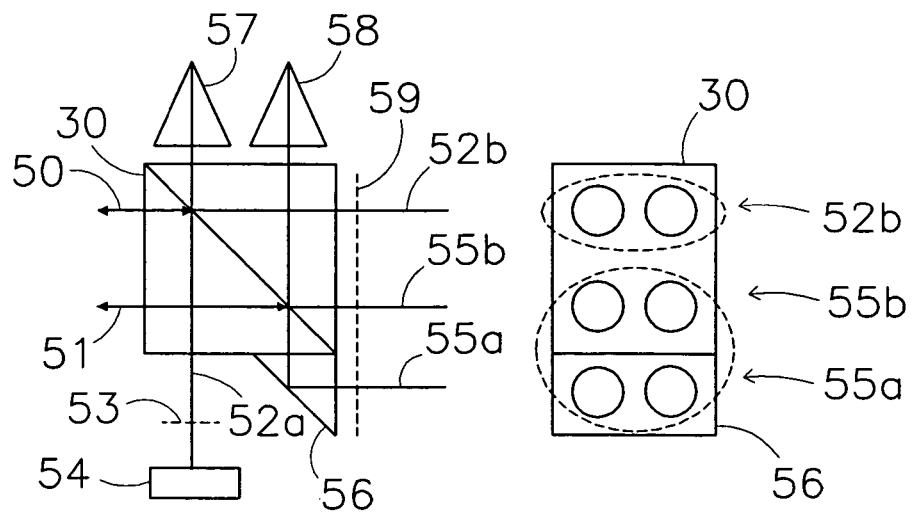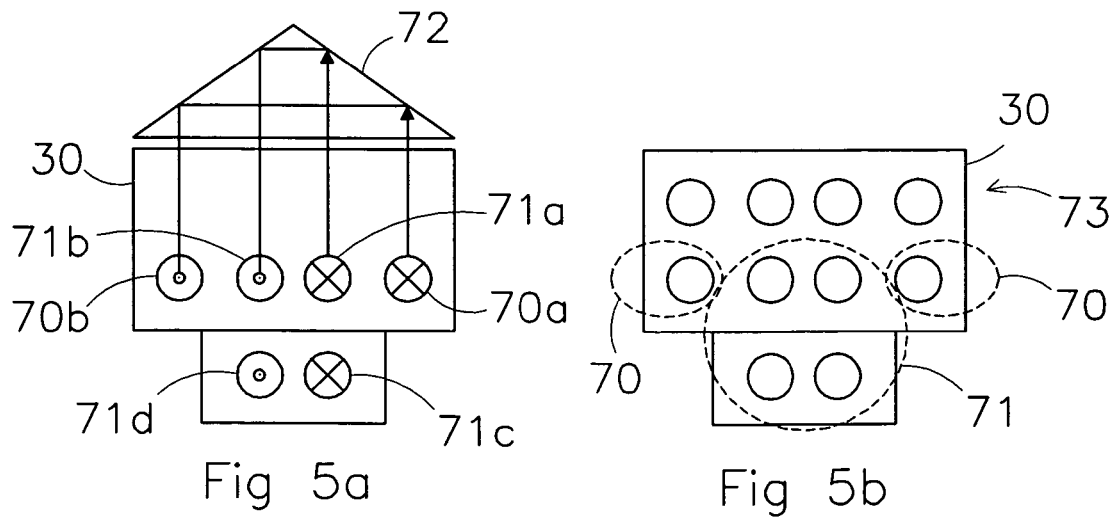

LITHOGRAPHIC INTERFEROMETER SYSTEM WITH AN ABSOLUTE MEASUREMENT SUBSYSTEM AND DIFFERENTIAL MEASUREMENT SUBSYSTEM AND METHOD THEREOF

PRIORITY INFORMATION

This application is a Continuation-In-Part of U.S. patent application Ser. No. 10/720,752, entitled "Improved Lithographic Interferometer System", filed on Nov. 25, 2003. The content of that application is incorporated in its entirety by reference.

BACKGROUND OF THE INVENTION

1. Field of the Invention

The present invention relates to lithographic apparatus and, more particularly, to an improved interferometer system employed in a lithographic apparatus.

2. Description of the Related Art

A lithographic apparatus is a machine that applies a desired pattern onto a target portion or target field of a substrate. Lithographic apparatus can be used, for example, in the manufacture of integrated circuits (ICs). In that circumstance, a patterning device, such as a mask (i.e., reticle), may be used to generate a circuit pattern corresponding to an individual layer of the IC, and this pattern can be imaged onto a target field (e.g. comprising part of, one or several dies) on a substrate (e.g. a silicon wafer) that has a layer of radiation-sensitive material (resist).

In general, a single substrate will contain a network of adjacent target portions or fields that are successively exposed. Known lithographic apparatus include so-called "steppers," in which each target field is irradiated by exposing an entire pattern onto the target field in one sweep, and so-called "scanners," in which each target field is irradiated by scanning the pattern through the projection beam in a given direction (e.g., the "scanning" direction) while synchronously scanning the substrate parallel or anti-parallel to this direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion/field", respectively. The substrate referred to herein may be processed, before or after exposure, in for example a track (a tool that typically applies a layer of resist to a substrate and develops the exposed resist) or a metrology or inspection tool.

Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

A support structure supports (i.e. bares the weight), of the patterning device. It holds the patterning device in a way depending on the orientation of the patterning device, the design of the lithographic apparatus, and other conditions, such as, for example, whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables or substrate holders and/or two or more mask tables or mask holders. In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g. water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Within a lithographic apparatus, interferometer systems may be used to measure distance and/or displacement. A basic interferometer system uses two, or more, bundles of radiation that are each reflected by a mirror, and are made to overlap and interfere. The overlap may cause constructive or destructive interference, depending on the phase difference of the radiation in the two bundles. This is visible in the form of interference fringes.

Because the wavelengths of each bundle are generally equal, a single bundle is typically split in two bundles by means of a beam-splitter. Another possibility is the use of a heterodyne system, in which distinct but very nearly equal frequencies are split up by the beam-splitter. This often relates to two Zeeman split frequencies having perpendicular polarization directions. The beam-splitter will be a polarizing beam-splitter. This offers the possibility of redirecting bundles by means of the beam-splitter surface before and/or after reflection.

A particular and well known advantage of interferometer systems is that it is possible to measure extremely small displacements, in the order of fractions of a wavelength. In the simplest form of the interferometer system, one interference fringe appears every half wavelength. However, it is possible to feed the interference signal to electronic detectors which are able to interpolate the measured signal in order to determine smaller displacements and increase measurement resolution.

Some lithographic systems employ a combination of interferometers that include a first interferometer system to measure displacement in substantially the X direction and a second interferometer system to measure displacement in the Z direction. In this combination, the measuring and reference beams of the second interferometer system (i.e., the Z measurement) are formed in a separate beam-splitter and are guided through bores in the second beam-splitter, which forms the reference beam and measuring beam of the first interferometer system (i.e., the X measurement). Note that the beam generation means comprise two separate beam-splitters, each of which split radiation beams in respective measuring beams and reference beams.

A disadvantage of the combination interferometer system is the complexity of the overall system, requiring two beam-splitters and the drilling of holes in one of them. Because beam-splitters are one of the most expensive parts of an interferometer system, the cost of such a system may be lowered and improved by providing a configuration that reduces the cost for the beam-splitters. Furthermore, the presence of holes for guiding the beams for the Z interferometer system limits the flexibility of the combined system and requires two labor-intensive alignment procedures.

SUMMARY OF THE INVENTION

Systems, apparatuses and methods consistent with the principles of the present invention, as embodied and broadly described herein, relate to an improved interferometer system capable of measuring displacement of an object in a plane substantially parallel to an XY plane, along one, two or more directions. In one embodiment, the interferometer system comprises one or more measuring mirrors, at least one of which is fixedly connected to the object to be measured, a beam generator for generating a plurality of radiation beams and directing the beams in desired directions that extending to and from the measuring mirrors, and a plurality of radiation-sensitive detectors, which convert radiation beams reflected by the measuring mirrors into electric measuring signals.

According to an embodiment of the invention, the interferometer system combines an absolute measurement subsystem and a differential measurement subsystem, for performing absolute and differential measurements in one or more directions, whereby the subsystems are part of one and the same optical housing. Note that the subsystems might perform a measurement in the same direction (for example an absolute measurement in an X-direction of a stage and a relative measurement in the X-direction of a lens with respect to the stage). Furthermore, note that the differential subsystem might be used to measure a tilt direction.

Such an interferometer system provides enhanced flexibility, reduced complexity, and reduced cost. Preferably, the need for a large beam-splitter is obviated.

In other embodiments, the radiation-sensitive detectors may be omitted, since they may be part of a measuring and control system that is separate from the actual interferometer system. Substantially parallel means that the tilt of the object with respect to the XY plane is at most 5°, and in many cases much less, for example less than 0.5°. Furthermore, the one, two or more directional axes need not coincide with a coordinate axis. They need not even be mutually perpendicular, but may for example be parallel. The directions of X, Y and Z may be selected as is convenient for a specific situation.

In other embodiments, the interferometer system for measuring displacement along one, two or more directions in an XYZ system of co-ordinates, of an object in a plane substantially parallel to an XY plane, comprises a plane mirror interferometer system and a differential plane mirror interferometer system. The interferometer system includes a beam splitter body, which is constructed and arranged for splitting up each of a radiation beam in the plane mirror interferometer system and a radiation beam in the differential plane mirror interferometer system in respective measuring beams and respective reference beams.

The interferometer system according to the invention provides flexibility and compactness through the use of two different interferometer systems that share their beam-splitter. Combining the two beam-splitters of two interferometer systems into one allows a smaller volume of the beam-splitter itself. Also, in combination with an appropriate layout of the beams to be used, it is possible to use smaller measuring mirrors, notably the measuring mirror(s) on the object (often a wafer stage).

In particular the height of such a measuring mirror, as measured in the z-direction when the object extends in the XY-plane, may be selected smaller, and hence the object as a whole. In turn, this allows the object to be made smaller and lighter, with its associated advantages as to mechanical driving thereof etc.

The object may be, for example, a holder with some other part or parts fixed thereto or therein, such as a wafer holder with a wafer. In such a case, it is the position of the wafer which needs to be measured, but since the wafer is fixed in the wafer stage, the position of the wafer is known as soon as the position of the wafer stage is known. Often this indirect measurement prevents problems with fixing a mirror to an object or part thereof.

The interferometer system according to this embodiment comprises a single beam-splitter and yet combines two types of interferometer in one device. In particular, these two types, called a plane mirror interferometer and a differential plane mirror interferometer.

A plane mirror interferometer is an interferometer system in which a reference beam is only reflected by one mirror, or possibly more mirrors, in a fixed position. It should be noted that in any practical situation considered here, a "fixed position" means a position that is fixed with respect to the beam-splitter, and most often directly fixed to the beam-splitter. The measuring beam is reflected by a mirror fixed to the object. A displacement of the object, or in general the object in which the object is fixed, causes a change in the optical path difference between the measuring beam and the reference beam, which gives direct information on displacement in the direction considered.

The second type, the differential plane mirror interferometer, uses a measurement set-up in which a measuring beam is again reflected by a mirror fixed to the object, and where a "reference beam" is reflected by at least one mirror not fixed to the beam-splitter. Various possible configurations exist to reflect the reference beam. For example, the reference beam may be reflected by a mirror fixed to the object, often the same mirror as the one that reflects the measuring beam. This will need some redirection of the reference beam, in order for the reference beam to also travel towards the object. This case allows to measure displacement of the object in two different positions, and hence offers the possibility of measuring tilt of the mirror(s), and hence of the object.

A second possibility is that a first mirror fixed to the object reflects the reference beam towards a second mirror, which may be e.g. a reference mirror arranged in a different direction. This redirection of the reference beam allows measuring displacement in the different direction, when the total measured displacement is corrected for the displacement of the first mirror. For example, the measuring beam is used to measure displacement in, say, the x-direction. The reference beam is reflected by a 45° mirror towards a z reference mirror. The displacement as measured by the reference beam consists of a displacement of the 45° mirror itself in the x-direction and a displacement of the object in the z-direction. Since this displacement in the x-direction is also measured with the measuring beam, it is possible, by combining the measuring beam and the reference beam and subtracting their displacements, to measure displacement in the z-direction. This will be further elucidated in the description of the figures. This possibility is sometimes referred to as a z differential interferometer, wherein the term "z" may be replaced by the appropriate term in corresponding cases. Note that in this case, the "reference beam" functions in fact as the "measurement beam", and vice versa. This indicates that the names for the various beams only serve the purpose of identification thereof.

A third possibility is when the reference beam is reflected by a mirror which is fixed to some other object. The other object may be an object which is movable with respect to the object. Of course, when the other object is in a fixed position with respect to the beam-splitter, this would correspond in principle with a simple plane mirror interferometer, sometimes also called absolute plane mirror interferometer. The arrangement allows the measurement of relative displacement of the object with respect to the other object. An example is, in the case of lithography, when the object is a wafer (or reticle) stage and the other object is a lens (e.g. of a projection system). The measurement will determine any (intended or unintended) displacement of the one with respect to the other, and allows correction in order to have a fixed mutual position during exposure etc. This third possibility is sometimes referred to as a differential plane mirror interferometer.

Therefore, another embodiment provides an interferometer system for measuring displacement along one, two or more directions in an XYZ system of co-ordinates, of an object in a plane substantially parallel to an XY plane, in which the system comprises at least one measuring mirror fixedly connected to the object and including a plurality of measuring mirror areas, at least one reference mirror comprising at least one reference mirror area, and a beam generator constructed and arranged for generating a plurality of radiation beams having an integral beam-splitter body having a beam splitting surface.

The interferometer system further comprising a plurality of radiation-sensitive detectors which convert radiation beams reflected towards the detectors into electric measuring signals, wherein the beam splitter body is constructed and arranged for splitting at least one first beam of the plurality of radiation beams in a first measuring beam and a first reference beam, the first reference beam only being reflected by one or more first reference mirrors located in a fixed position with respect to the beam-splitter body, the first measuring beam being reflected by a first measuring mirror area of the plurality of measuring mirror areas, and wherein the beam splitting surface is constructed and arranged for splitting at least one second beam of the plurality of radiation beams in a second measuring beam and a second reference beam, the second measuring beam being reflected by a second measuring mirror area of the plurality of measuring mirror areas, and the second reference beam being reflected by a first reflector that is fixedly positioned with respect to the beam-splitter body and by at least one third mirror area, which is movable with respect to the beam-splitter body.

In this embodiment, the term "mirror area" is intended to mean "part of a mirror surface". This means that e.g. two mirror areas may be part of one and the same physical mirror. In principle, two mirror areas may even overlap. It is only used as a kind of "name" for some mirror surface part. It is not strictly related to the number of mirrors actually present. Wherever in this application the term "mirror" is used, it is to be understood that this comprises "mirror area".

Note that the first reflector serves to be able to direct the second reference beam in a desired direction, i.e. towards a mirror area that serves as a reference. In a conventional plane mirror interferometer, this first reflector is not necessary, since the reference mirror is directly attached to the beam-splitter. In the present case, the second reference beam is to be directed towards either a mirror (area) on the object, or a mirror (area) on another object, which is located in, or is movable in an XY plane.

It will be appreciated that the second reference beam need not be an absolute reference, because its optical path length may differ from measurement to measurement. However, for convenience, the indication "reference" is retained in the present description. Furthermore, whenever the word "mirror" is used it is understood to encompass an ordinary mirror (metal mirror, coated glass etc.), a prism and a (retro) reflecting corner cube as well, where appropriate.

The principles of the above-mentioned three possible configurations will be further elucidated in the description of the embodiments. Suffice it here to say that, in the interferometer system according to the invention, the second reference beam is reflected towards a second mirror area, which however need not be positioned perpendicularly with respect to the reference beam. In other words, it need not be the only mirror (area), there optionally being another mirror, corner cube etc. for reflecting the second reference beam to the radiation-sensitive detector.

The presence of two types of interferometers in the interferometer system according to the invention ensures optimum flexibility. Furthermore, the presence of only one beam-splitter allows a simpler design. This not only reduces costs through cheaper fabrication, but also because of a simpler alignment of the various beams, which may now be performed in one action. Furthermore, a simpler design with fewer parts improves the stability of the whole interferometer system.

It will be appreciated that U.S. Pat. No. 6,020,964 discloses an interferometer system for measuring displacements in X and/or Y direction as well as the Z direction. However, the embodiments shown either do not comprise a differential plane mirror interferometer, or are of a highly complex design, in which a separate prism system with a partially transparent mirror and a so-called λ/2 plate are required for forming and measuring secondary reference (and measuring) beams. This requires the presence of a separate second beam-splitter, with all the accompanying disadvantages of complexity and alignment difficulty. Furthermore, here too, a reference mirror in a position fixed with respect to the beam-splitter is always required.

The interferometer system according to the invention may be constructed to allow measurement of displacement in X and/or Y direction, as well as Z direction. Here, as in all of the present application, the XY plane substantially is taken to correspond to a plane in which an object extends also, which is often but not always a direction perpendicular with respect to the vertical or line of gravity, whereas the Z direction is perpendicular to the XY-plane and parallel to the vertical or line of gravity. However, any other orientation is possible as well.

Another useful orientation is to consider the plane of a flat object as the XY-plane, e.g. in the case of a wafer to be exposed to radiation. A transformation to other co-ordinate systems is a simple mathematical process. An example is a system with radius, angle of rotation and Z, which is useful in determining rotation of a object. In this latter case it is advantageous to use at least two measuring beams on the same mirror of the object, in order to determine a relative displacement of the mirror in at two points of the mirror. In this way it is also possible to measure tilts and rotations, by measuring displacement in the same direction for two or more positions on a surface. Preferably, such relative displacement is measured in three positions not in one line. This allows a complete determination of the orientation of the plane considered and changes therein, apart from a possible rotation in the plane of the mirror surface. Note that in such an arrangement, the function of the measuring beam and the reference beam are indistinguishable and the beams may be interchanged.

The first reflector which is present in the interferometer system according to the present invention, is one of a flat mirror and a prism. The flat mirror may for example be a metallic mirror or coated glass, while the prism may be a standard body of a material transparent for the associated radiation beam. It is stressed here that the only function of a prism here is to reflect an incident beam in a desired direction, either through the principle of total internal reflection or through a reflective coating on its sides.

Although it is not necessary, in practice it is very common for the various reflectors, mirrors and the beam splitting surface to be arranged at an angle of 0°, 45° or 90° with respect to the beams of radiation. This simplifies alignment of the various beams. The first reflector may be separate from the beam-splitter body, for example to allow the reflector to be easily changed. However, advantageously, the first reflector is directly and fixedly connected to the beam-splitter body. In the case of the first reflector being a prism, the first reflector is preferably integral with the beam-splitter body. In this respect, the term integral should be interpreted as optically and mechanically fixedly connected to the beam-splitter body. This comprises a continuous piece of material, but also a prism which is adhered to the beam-splitter body by means of e.g. optically transparent adhesive.

Advantageously, at least one third mirror area comprises a third measuring mirror area fixed to the object. In this case, both the second measuring mirror area and the third measuring mirror area are fixed to the object. This situation relates to the second reference beam and the second measuring beam being reflected by the second measuring mirror area and the third measuring mirror area, respectively. In other words, both beams are (each) directly reflected by a mirror area on the same object, and hence indicate displacement of the object in two positions. In principle, the second and third mirror area may be one and the same mirror surface, although two different mirrors would work in the same way. This arrangement is very useful for measuring tilt and/or rotation.

In another advantageous embodiment, at least one third mirror area comprises a second reflector fixed to the object and a second reference mirror area located in a fixed position with respect to the beam-splitter body, wherein the second reflector is arranged to direct the second reference beam towards the second reference mirror area. This situation relates in particular but not exclusively, to a situation for measuring Z displacement by means of redirecting a measuring beam which is emitted from the beam-splitter in a direction parallel to the XY plane.

In another advantageous embodiment, at least one third mirror area comprises a fourth mirror area which is fixed to a second object, which is movable with respect to the beam-splitter body. This embodiment relates to the case wherein a relative displacement of the object with respect to the second object is measurable, e.g. a displacement of a stage with respect to a lens in a lithographic apparatus.

It is to be noted that all above embodiments may be further combined into one interferometer system according to the invention. This further improves the versatility of the system in a very small volume. Some of these cases will be further elucidated below, as preferred embodiments, in particular regarding the layout of their beam patterns.

Advantageously, the plurality of radiation beams comprises at least three first beams not in one plane, as well as at least one second beam in a position between two of the at least three first beams, and preferably in a symmetrical position therebetween. In particular, two of the at least three first beams are in a plane substantially parallel to the XY plane and at least one second beam is in a position between the latter two beams. This arrangement is very useful in determining a number of displacements. The three first beams are e.g. directed towards the same measuring mirror. This indicates that these three first beams measure displacement in the same main direction. This way, both absolute displacement in the direction, e.g. the X direction, as well as rotation and tilt may be determined. The position, and a change of orientation, of the measuring mirror may thus be determined in a three point measurement. At least one further degree of freedom, such as a translation or rotation in the plane of the mirror, may be determined by a further measurement. Thereto, at least one second beam may be used. Thereto, a first and second reflector are present for directing at least one second beam through two subsequent reflections towards a Z reference mirror in a fixed position with respect to the beam-splitter body. This will be further elucidated in the drawing and the description thereof.

Note that it is not necessary to use three measuring beams for the same measuring mirror. Sometimes it suffices to use two measuring beams, in order to be able to determine a rotation or tilt, without fully knowing the exact orientation of the measuring mirror. In other cases even more measuring beams may be used, e.g. as a check for the measurements.

In another advantageous embodiment the plurality of radiation beams comprises at least three first beams not in one plane, as well as at least one second beam in a position outside a polygon volume formed by connecting the first reference beams and the first measuring beams. This arrangement of the plurality of radiation beams may offer certain advantages in various situations. For example, the at least three first beams may be conditioned by blowing a gas with well controlled properties in the paths of the beams, whereas the at least one second beam is not, or at least to a much lesser extent. Note however, that the volume of the beam-splitter may increase by this asymmetric arrangement. However, this disadvantage is less critical by using a beam-splitter body in which the beam splitting surface runs in a plane at an angle of 45° to the plurality of radiation beams. In particular, the beam-splitter body may be given a shape with a square side view and a rectangular front view, in which the front is the face of the body from which the measuring beam(s) is(are) emitted. When the beam splitting surface runs along the diagonal of the square faces, the dimensions of the body are smallest.

This advantageous location of the beam splitting surface gives similar advantages in the other embodiments of the interferometer system according to the invention. Note however that rotation of the complete system of beam-splitter body, first reflector and the plurality of radiation beams allows similar advantages to be obtained, possibly requiring a simple adjustment of second reflector and/or measuring mirror.

In a further aspect of the invention, there is provided a beam-splitter body for use in an interferometer system according to the invention, comprising a transparent body having a beam-splitter surface and a first reflector which is integrally connected to the transparent body and which has a reflective surface that extends substantially parallel to the beam splitting surface. Such a beam-splitter body offers a very compact and versatile part of an interferometer system, with all the design possibilities as described above. The expression "substantially parallel" is intended to mean that the normal to the beam-splitting surface and the normal to the reflective surface include an angle which is smaller than 20°, and particularly equals about 0°. This ensures that the beam-splitter body is able to redirect incoming beams away from the beam-splitter body. Preferably, the beam-splitter body and the first reflector form one integral body.

In principle, the interferometer system according to the invention may be applied in any desired apparatus. In particular this will be useful in very precise measuring equipment, and apparatus using lasers. A particularly advantageous application is in the field of lithography, because there it is very important to be able to measure very small distances of a few nm or even less. This is helpful in order to be able to manufacture devices with features on a comparable scale, such as is required for e.g. VLSI chips. Also, in order to manufacture features which are not necessarily extremely small, but need to be made in many different steps, in different locations, a very good reproducibility is needed, which requires very precise measuring of distances and displacements.

Hence, according to a further aspect of the invention, there is provided a lithographic apparatus comprising: an illumination system for providing a beam of radiation, a support structure for supporting a patterning mechanism, the patterning mechanism serving to impart the beam with a pattern in its cross-section, a substrate holder for holding a substrate, a projection system for projecting the patterned beam onto a target portion of the substrate, and an interferometer system according to the invention for measuring displacement of at least one of the patterning mechanism and the substrate.

A lithographic apparatus is a machine that applies a desired pattern onto a target portion of a substrate. Lithographic apparatus can be used, for example, in the manufacture of integrated circuits (ICs). In that circumstance, a patterning means, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

According to a further aspect of the invention, there is provided a device manufacturing method comprising: providing a substrate, providing a beam of radiation using an illumination system, using a patterning mechanism to impart the beam with a pattern in its cross-section, and projecting the patterned beam of radiation onto a target portion of the substrate, wherein a position of at least one of the patterning means and the substrate is determined with the use of an interferometer system according to the invention.

Use of the interferometer system according to the invention offers the possibilities of determining very small distances and displacements, with the accompanying advantages as discussed above, in connection with the advantageous lithographic apparatus.

Although specific reference may be made in this text to the use of lithographic apparatus in the manufacture of ICs, it should be understood that the interferometer system as well as the lithographic apparatus described herein may have other applications, such as in the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. Further, the substrate referred to herein may be processed, before or after exposure, in for example a track (a tool that typically applies a resist to a substrate and develops the exposed resist) or a metrology or inspection tool. Where applicable, the disclosure herein may be applied to such and other substrate processing tools.

The terms "radiation" and "beam" used herein with respect to the interferometer system encompass many types of electromagnetic radiation, such as infrared, optical and ultraviolet radiation. Generally, a shorter wavelength allows a more precise determination of displacement.

With respect to the lithographic apparatus, radiation may encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams. This radiation is used for exposing various materials and should be discerned from the radiation used in the interferometer system for determining displacement. The radiation used in the lithographic apparatus will not be further elucidated here.

The terms "patterning device" and "patterning mechanism" used herein should be broadly interpreted as referring to devices that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning means, the support structure may be a frame or table, for example, which may be fixed or movable as required and which may ensure that the patterning means is at a desired position, for example with respect to the projection system. Any use of the terms "reticle" or "mask" herein may be considered synonymous with the more general term "patterning device".

The terms "illumination system" and "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

BRIEF DESCRIPTION OF THE DRAWINGS

Embodiments of the invention will now be described, by way of example only, with reference to the accompanying schematic drawings in which:

FIGS. 3a-3d schematically depict four cross-sectional views of a part of an interferometer system, in accordance with an embodiment of the invention;

FIGS. 4a-4b depict two configurations, each in a cross-sectional view and a front view, of a part of an interferometer system in accordance with an embodiment of the invention;

FIGS. 5a, 5b both show a front view of an alternative embodiment of a part of an interferometer system, including a retro-reflector, in accordance with another embodiment of the invention;

FIG. 9 depicts a top view and a cross-sectional view of the embodiment according to FIG. 8a.

In the description, as in all of the drawings, similar reference numerals denote similar elements. Furthermore, wherever a mirror is depicted, described or indicated, it may consist of a single mirror surface or it may comprise a number of mirror areas.

DETAILED DESCRIPTION

Figure 1:
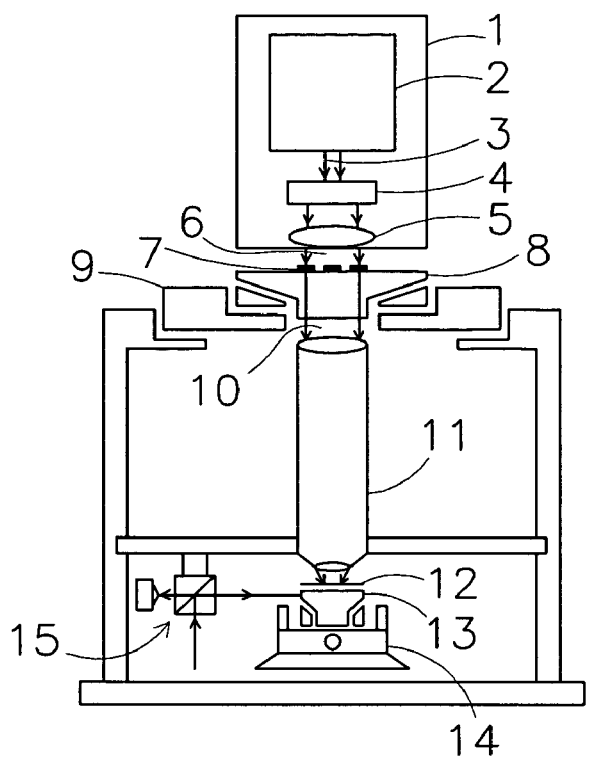
FIG. 1 schematically depicts a lithographic apparatus, in accordance with an embodiment of the invention.

FIG. 1 schematically depicts a lithographic apparatus according to an embodiment of the invention. The arrangement of the depicted lithographic system is in principle well known in the art. A brief description will therefore suffice for a person skilled in the art.

Herein, 1 indicates an illumination system, comprising a source 2 of radiation, emitting a beam 3 of radiation. A beam expander 4 and beam shaping means 5 form the beam 3 into projection beam 6. Projection beam 6 passes through mask 7, which is placed on mask table 8, which is moveable by means of mask table moving means 9.

A beam 10 passes through projection optics 11 and strikes the surface of wafer 12, which is located on wafer stage 13. The wafer stage 13 may be displaced by means of wafer stage moving means 14, and the displacement may be determined by means of (schematically) interferometer system 15.

The illumination system 1 comprises a source 2 of radiation, for example a laser, having a wavelength of between about 120 nanometer and 400 nanometer. The laser beam 3 may be expanded to a desired width by means of a beam expander 4. Note, however, that other types of radiation and sources therefore are also contemplated, e.g. sources of extreme ultraviolet radiation, having wavelengths of about 5 to about 30 nanometer, particle beams, optical radiation etc.

Beam shaping mechanism 5 may comprise optical elements which impart characteristics to the beam 3. This may for example comprise uniformity correction devices, such as special filters etc. Furthermore, beam shaping mechanism 5 may comprise optical elements to filter a certain wavelength, a certain angular distribution etc.

The resulting projection beam 6 passes through a mask 7. The mask 7, which term should be interpreted broadly as to include devices which impart a desired pattern to the projection beam 6, is fixed to a mask table 8, which allows the passing of the projection beam 6, which has been turned into a patterned beam 10 by means of the mask 7. The mask table 8 may be displaced by means of mask table moving mechanism 9. Mask table moving mechanism 9 may comprise any desired motor, such as piezo-electrical motors etc.

The patterned beam 10 passes through projection optics 11, which not only guide the patterned beam 10 towards the desired target, but they also serve to impart further desired features to the patterned beam 10. It may be contemplated to magnify or reduce the diameter of the beam 10, etc. After passing through the projection optics 11, the patterned beam will strike the surface of a wafer 12, or generally a target surface. The wafer may comprise a specially prepared semiconductor wafer, e.g. for the production of chips. However, in principal any desired target which is to be illuminated by means of the patterned beam 10 is also possible.

The wafer stage 13 may be displaced by means of wafer stage moving mechanism 14 by means of any desired and appropriate motor. The displacement of the wafer stage 13 may be completely independent, or may be coupled to displacement of the mask table 8, e.g. in the case of a scanning lithographic apparatus. Displacement of the wafer stage 13 may be measured by means of an interferometer system 15. Likewise, any displacement of the mask table 8 may be determined by means of a second interferometer system (not shown).

Figure 2:
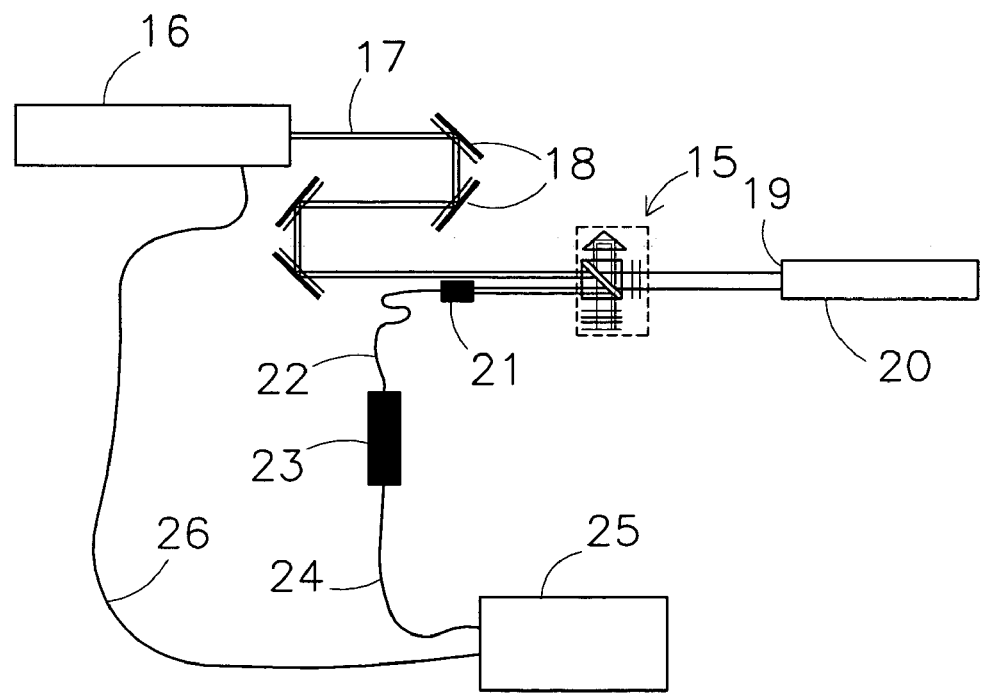
FIG. 2 schematically depicts an overview of an interferometer system, in accordance with an embodiment of the invention.

FIG. 2 schematically depicts an overview of an interferometer system, in accordance with an embodiment of the present invention. Herein, 16 represents a laser source, emitting a laser beam 17 which is guided by means of beam delivery mirrors 18 to a beam-splitter block 15. Part of the laser beam 17 is reflected by an object mirror 19 which is located on an object 20.

The reflected and interfering beams are received by an optical receiver 21, which transports the optical signal by means of a fiber 22 to an electrical receiver 23. The electrical receiver 23 converts the optical signal into an electrical signal and outputs this electrical signal to signal processing means 25 by means of a signal cable 24. Furthermore, an optional reference signal cable 26 connects the laser source 16 and the signal processing mechanism 25.

The laser source may be selected as to stability of the laser beam. It may be a single wavelength type or a double wavelength type (e.g. with Zeeman split), as is known to the person skilled in the art. The emitted laser beam 17 may, if desired, be guided by means of beam delivery mirrors 18 to a beam-splitter block 15. Furthermore, it is possible to include one or more means for splitting the laser beam 17 into separate beams (not shown). This may be employed to be able to use more than one interferometer system. An example may be separate interferometer systems for determining displacements of the wafer stage and the mask table. Other arrangements are possible, and some will be elucidated below.

The beam-splitter block 15 is shown only in a general form and will also be elucidated below. For the present application, the beam-splitter block 15 comprises at least one beam-splitter, at least one retro-reflector, and at least one mirror.

Generally, the principle of an interferometer system is to measure displacement by means of counting interference fringes of two interfering laser beams. One of the laser beams is a reference beam of known properties, in particular having a constant optical path length. The other laser beam, or measuring beam, is reflected by a mirror which is rigidly connected to an object, the displacement of which is to be determined. When the two laser beams are combined after their being reflected, they will show interference. This interference may be destructive, in the case of a path length difference of $(n+\frac{1}{2})\lambda$, and may be positive or constructive in the case of a path length difference of $n\lambda$, with intermediate cases for different path length differences.

When the object, for example object 20, is displaced, the path length of the measuring beam will change, and so will the interference pattern. In particular, a number of interference fringes will appear. By counting the number of interference fringes, and interpolating if desired, the displacement of the objects to be measured may be determined by simple calculations.

Turning back to FIG. 2, the optical receiver 21 receives the combined laser beams and their interference pattern. The optical signal which is receiver by the optical receiver 21 is transported to electrical receiver 23 by means of an optical fiber 22. The electrical receiver 23 converts the optical signal, in particular an optical intensity thereof, to an electrical signal by means of e.g. a photodiode.

The electrical signal is subsequently output to signal processing mechanism, which may comprise a computer for counting interference fringes, and interpolating therebetween. The signal processing mechanism 25 may determine displacement information from the measured signal, which displacement information may be used in controlling the apparatus in which the object 20 is moved. The laser source 16 may be connected to the signal processing mechanism 25 by means of a reference signal cable 26.

FIGS. 3a-3d schematically depict four cross-sectional views of a part of an interferometer system according to the invention, with paths of beams. In particular, FIGS. 3a-3d depict a part of an interferometer system, in accordance with an embodiment of the present invention, which relate to parts 15, 19 and 20 of the interferometer system depicted in FIG. 2.

In FIG. 3a, 30 denotes a polarizing beam-splitter, with a beam splitting surface 31. Incident laser beam 17 is split in a reference beam 32 and a measuring beam 36. Reference beam 32 is reflected by the beam splitting surface 31, passes through a $\frac{1}{4}\lambda$ plate, and is reflected by reference mirror 34. Measuring beam 36 passes through $\frac{1}{4}\lambda$ plate 37 and is reflected by measuring mirror 38, which is rigidly attached to an object that is capable of displacement, i.e., object 39. Both reference beam 32 and measuring beam 36 are retro-reflected and shifted by retro-reflector 35. After traveling to and from the at least one mirror, the beams are combined on the receiver, where they will produce an interference pattern, as discussed above.

In FIG. 3b, the path of the measuring beam 36 is substantially similar to the path in FIG. 3a. However, reference beam 32 is redirected. That is, after having passed the $\frac{1}{4}\lambda$ plate 33, the reference beam 32 is reflected by a first 45° mirror towards a second 45° mirror 41, and subsequently to a Z reference mirror 42.

The arrangement illustrated in FIG. 3a is referred to as a "plane mirror interferometer," while the arrangement illustrated in FIG. 3b is referred to as a "differential plane mirror interferometer." Both types may be combined in one polarizing beam-splitter 30, according to the invention. FIGS. 3a and 3b are to be considered as cross-sections in two different parts of the polarizing beam-splitter 30, in mutually parallel planes. This will be described below.

In FIG. 3a, the complete path of the reference beam 32 is as follows: first, the laser beam 17, which comprises two mutually complementary polarizing directions, is split into a reference beam 32 and a measuring beam 36, with one of the mutually complementary polarization directions each. This split in two beams is achieved at the beam splitting surface 31. At the beam splitting surface 31, the reference beam 32 is reflected downwards, passes through $\frac{1}{4}\lambda$ plate 33, is reflected by reference mirror 34, again passes through $\frac{1}{4}\lambda$ plate 33 and re-enters the polarizing beam-splitter 30. Since the two passes through the $\frac{1}{4}\lambda$ plate 33 have added a phase difference of, in all, $\frac{1}{2}\lambda$, the polarization direction of the reference beam 32 has changed such that it will now pass the beam splitting surface 31 unimpeded. It will then go to the retro-reflector 35, which may be a roof prism, or preferably a corner cube. The retro-reflector 35 will serve to displace the reference beam 32 in a parallel fashion with respect to itself.

Next, the retro-reflected reference beam will again pass the beam splitting surface 31, pass the $\frac{1}{4}\lambda$ plate 33 twice, with a reflection at reference mirror 34, and will again enter the polarizing beam-splitter 30. By now, the polarization direction will have changed again because of the added phase difference of $\frac{1}{2}\lambda$, and the reference beam 32 will now be reflected by the beam splitting surface 31 in the reverse direction of the original laser beam 17. The beam will now leave the polarizing beam-splitter 30, in a direction parallel to the input direction.

The part of the laser beam 17 with, originally, a polarization direction which is complementary to that of the original reference beam, will first pass the beam splitting surface 31, to become the measuring beam 36. The path through the system will show similarities to the path of the reference beam 32, and will not be elucidated in all detail. Suffice it to say that the polarization direction is changed by $\frac{1}{4}\lambda$ plate 37, and the measuring beam 36 will be reflected by measuring mirror 38, which is rigidly connected to the object 39.

After going through the system, the measuring beam 36 will ultimately be combined with the reflected reference beam 32, and both reflected beams will leave the system and will provide information regarding displacement of the object 39.

In the arrangement of FIG. 3b, the path of the measuring beam 36 is similar to that in the arrangement of FIG. 3a, and will not be elucidated further. In FIG. 3b, the reference beam 32 will not be reflected by reference mirror 34, but will, instead, be reflected by the first 45° mirror 40 in a direction parallel to the original laser beam 17, and towards a second 45° mirror 41. The second 45° mirror 41 is also rigidly connected to object 39, and will direct the reference beam 32 upwards in the direction of Z reference mirror 42. The reference beam 32 will now retrace its steps, after which the rest of the path is similar to that in the arrangement according to FIG. 3a.

Note that the first and second 45° mirrors 40, 41 respectively, may be mirrors, or prisms. In particular, the first 45° mirror 40 may be a prism which is combined with the polarizing beam-splitter 30. This combination may be achieved by gluing the prism and the polarizing beam-splitter 30 together with appropriate adhesives, or, for example, they may be integrally formed from one material.

The effect of the arrangement according to FIG. 3b, or differential plane mirror interferometer (differential plane mirror) is as follows: if object 39 is displaced in a direction parallel to the measuring beam 36 only, then the optical path lengths of reference beam 32 and measuring beam 36 will change in a similar fashion, with the result that the path length difference remains constant. However, if the object is displaced in a direction perpendicular to the direction of the laser beam 17 only, then the optical path length of the measuring beam 36 will remain constant, while the optical path length of the measuring beam 32 will change, with the result that the path length difference will change. The directions may, for example, be as indicated in FIG. 3b, but in principle they may be selected in any other appropriate fashion, e.g. the Y en Z direction and so forth.

The differential plane mirror interferometer system as shown in FIG. 3b may thus be employed to determine displacement in another direction as may be determined by the arrangement according to FIG. 3a. And, by combining the arrangement of FIG. 3a and the arrangement by FIG. 3b into one polarizing beam-splitter 30, a very versatile interferometer system is provided, which is capable of determining displacement in two different directions with only one polarizing beam-splitter 30. This is very advantageous, in that such a polarizing beam-splitter 30 is one of the most expensive parts of an interferometer system.

Many modifications of the arrangements shown are possible. For example, as is shown in FIG. 3c, reference beam 32 is now directed to a third mirror 43 which is fixed to the object 39. Although this third mirror lies in a plane parallel to the measuring mirror 38, this is not necessary. In this arrangement the reference beam 32 will now be used to measure displacement in the same direction as the direction for measuring beam 36. The change in optical path length difference may then be used to determine a tilt or rotation of the object 39. When the object or object moves only in the direction indicated by arrow A, the optical path lengths of the reference beam 32 and the measuring beam 36 will change with an equal amount. If however, the object rotates around an axis not parallel to the measuring beam 36, the optical paths lengths will change differently, which measured difference is an indication for the tilt or rotation of the object or object 39. Note that the third mirror 43 and the measuring mirror 38 may in fact be one and the same mirror.

FIG. 3d shows another modification, in which the reference beam 32 is directed towards a fourth mirror 45, which is fixed to a second object (or object) 44, which is also movable, as indicated by arrow B. In this case the optical path lengths with respect to two different objects, 39 and 44, are measured. This allows the determination of a relative position and shift thereof. If one object, e.g. object 39, moves in, say, the direction of arrow A, and/or the other object 44 moves in the direction of arrow B, the difference in optical path length will change and the interference pattern will change.

For example, if the two objects need a certain fixed position with respect to each other, a shift may be measured and corrected for by means of motors etc. Or it possible to control an intended movement of the one object with respect to the other, in e.g. a scanning lithographic apparatus. Note furthermore that it is possible to integrate more than one of such differential interferometer in order to be able to measure a relative displacement in more than one direction.

By including more than one laser beam 17, it is possible to measure displacement in e.g. the X direction for more than one position on the measuring mirror 38. This may be employed to determine an orientation, and change thereof, of the measuring mirror 38. A measurement in at least three points will suffice to determine the orientation with sufficient accuracy.

It is to be noted that, in the case of the arrangements of FIG. 3a and FIG. 3b being combined, the indicated laser beam 17 will be two parallel beams. These may have been formed by splitting an original laser beam into two mutually parallel laser beams.

The system with the combined interferometer arrangements (differential plane mirror and (absolute) plane mirror) is furthermore versatile, in that two or more arrangements of each type may be combined. Moreover, the first 45° mirror 40 may be replaced by a plane mirror, like reference mirror 34, if desired. Note that the position of either reference mirror 34 or first 45° mirror 40 is fixed with respect to the optical beams splitter 30. It is still however possible to set the position with respect to the polarizing beam-splitter 30, in order to be able to measure displacements on different locations on the object 39 to be measured.

FIG. 4a shows a cross-sectional view (left) and a front view (right) of a beam-splitter block, in accordance with an embodiment of the present invention. Herein, 30 denotes a polarizing beam-splitter, 50 denotes a first laser beam, 51 a second laser beam.

First laser beam 50 is split into a first reference beam 52a, which passes a first ¼λ plate 53 and is reflected by reference mirror 54, as well as a first measurement beam 52b, which passes a second 1/4λ plate 59 and will be reflected by a mirror on an object to be measured (not shown). Second laser beam 51 is split into a second reference beam 55a and a second measurement beam 55b. Second reference beam 55a is guided by means of prism 56, and passes through second ¼λ plate 59, while second measurement beam 55b also passes through ¼λ plate 59.

Retro-reflectors 57, 58 serve to retro-reflect and displace the corresponding reference beams and measuring beams.

The front view in the right half of FIG. 4a shows a polarizing beam-splitter 30 and six laser bundles emitted from and entering into the polarizing beam-splitter 30. The two laser bundles in the upper ellipse correspond to the measuring beam 52b. The lower ellipse comprises two measuring beams 55b, one entering and one leaving the polarizing beam-splitter 30, while the lower two correspond to two second reference beams 55a, again one entering and one leaving prism 56.

The arrangement of the beam splitter block as shown in FIG. 4a is a compact design and allows differential measurements in one or more directions.

In an even more advantageous embodiment (not shown) the two laser beams 50 and 51 are supplied in a plane which is parallel to the lower side of the polarizing beam-splitter 30, i.e. the side facing a first reference mirror 54 and the prism 56. In this case, the volume of the polarizing beam-splitter 30 may be effectively halved, which is very advantageous considering the cost of the polarizing beam-splitter 30. Note that this arrangement is possible when the two laser beams are supplied from the back (i.e. the face which is opposite the front that faces the object to be measured), the top or the bottom, i.e. the side facing the retro-reflectors 57, 58, the side facing the first reference mirror 54, respectively, in the arrangement according to FIG. 4a. If the laser beams would be supplied from the sides, i.e. the planes parallel to the plane of the paper according to FIG. 4a, it would not be possible to use the most compact arrangement. Note however that it is possible to rotate the complete beam-splitter block (i.e. the arrangement of FIG. 4a) over e.g. 90°. In that case the advantageous sides from which the laser beams may be supplied are to be adapted accordingly.

FIG. 4b depicts a cross-sectional view and a front view of a slightly more complex interferometer system, in accordance with an embodiment of the present invention. Moreover, 62 denotes a second reference mirror which is arranged adjacent prism 56. 60b and 61b denote two further sets of measuring beams, each comprising one beam leaving the polarizing beam-splitter 30 and one entering it.

In the arrangement according to 4*b*, use is made of the particular advantages of the invention, viz. the versatility and compactness of the design. In the embodiment shown in FIG. 4*b*, one part of the arrangement relates to a differential plane mirror interferometer, e.g., the four beams within the dashed ellipse 55, while three sets of beams relate to e.g. X measuring beams, in this case the three sets within the ellipses 52*b*, 60*b* and 61*b*.

Note that first reference mirror 54 reflects the reference beam 52*a* (not shown here) corresponding to measuring beam 52*b*, while the reference beams which correspond to measuring beams 60*b* and 61*b*, which are not shown here, are reflected by an additional reference mirror 62. Such a reference mirror will have a fixed position with respect to the polarizing beam-splitter 30. In most cases, it will be a mirror which is directly attached to the polarizing beam-splitter, although it may be fixed in a spaced apart position.

The arrangement shown in FIG. 4*b* may for example measure displacement in the Z direction, by means of the beams 55, whereas the remaining beams, i.e. 52, 60 and 61, may be used to perform a three-point measurement in the X direction, in order to determine displacement for different degrees of freedom. However, as described above, it would also be possible to measure e.g. displacement in the Y direction instead of in the X direction, either by rotating the system over 90°, or by adapting the 45° mirrors accordingly.

An additional advantage is that there are only three beam "layers", i.e. three different levels on which beams are emitted towards the object to be measured. This also offers possibilities to reduce cost and size of e.g. mirrors on the object.

FIGS. 5*a* and 5*b* both show a front view of an alternative embodiment of a part of an interferometer system, including a retro-reflector, in accordance with an embodiment of the present invention. FIG. 5*a* shows the arrangement with the path of corresponding beams in the retro-reflector, while FIG. 5*b* shows the same arrangement, with added beams and, for clarity, omitting of the retro-reflector.

Herein 70*a* denotes one beam of a first set of two corresponding beams, that enters the polarizing beam-splitter, while 70*b* represents the corresponding beam which exits the polarizing beam-splitter 30. Similarly, 71*a* denotes a measuring beam of a second set of in all four beams, that enters the splitter 30, while 71*b* denotes the corresponding exiting measuring beam, 71*c* denotes an incident reference beam of the second set, while 71*d* denotes the corresponding exiting reference beam. Each beam is linked to its corresponding beam by the action of the retro-reflector 72, as shown. Note that the reference beams 71*c* and 71*d* travel along paths that overlie the paths of the measuring beams 71*a* and 71*b* in the drawing, although in reality they are separated.

In this embodiment, only one retro-reflector is needed, with the corresponding advantage of less problems relating to aligning the retro-reflector and the laser beams, and other costs relating to work load (fewer parts). Furthermore, the arrangement is completely symmetrical, which may provide additional advantages in terms of precision and ease of alignment. An advantage of the use of two, or more, smaller retro-reflectors is that less material is needed. Furthermore, the specifications of the mirrors used are less strict, as to flatness per surface area etc.

In FIG. 5*b*, the same basic arrangement is shown, in which the retro-reflector, in most cases a so-called corner cube, is omitted for clarity, and in which two more sets of beams are included in a third "layer". Those two extra sets of in total four beams are indicated generally by 73. These two additional sets of beams may be used for additional measurements. Here, they are added in a "layer" above the two layers consisting of 70*a,b* and 71*a,b* on the one hand, and 71*c,d* on the other hand. This offers a reasonably compact arrangement, with comparable dimensions for the polarizing beam-splitter 30 in all directions. However, for smallest total volume of the polarizing beam-splitter it is advantageous if also the additional sets of beams are supplied in the same "layer" as the beams 70*a,b*. Then the beam-splitter is only twice as long, instead of both twice as high and twice as wide, for a symmetrical, square layout of the beam-splitter.

In the example shown in FIG. 5, beams 73 may be arranged in line with the beams 70, to form one row of 8 beams in all. This would allow a reduction of both the height and the "width" (i.e. the dimension in the direction perpendicular to the plane of the paper) of the beam-splitter body 30 by a factor of two, whereas only the length (the horizontal direction in the Fig.) needs to be doubled. This allows a net volume reduction of 50%. In this example it is assumed that the beam-splitter body 30 has a square cross-section in a side view.

Figure 6:
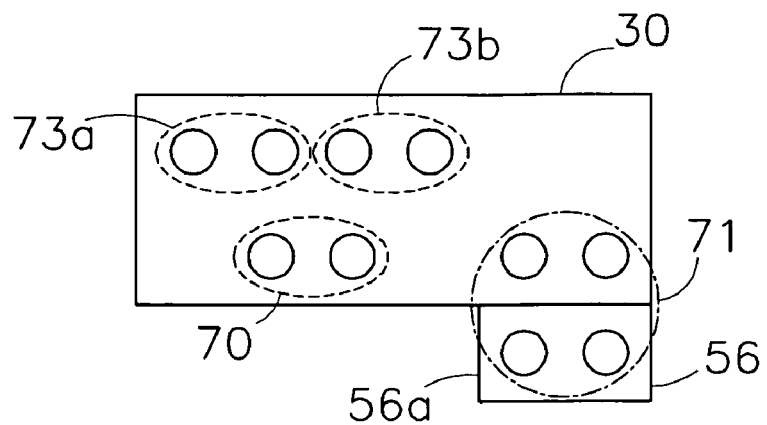
FIG. 6 depicts a front view of another embodiment of a part of an interferometer system according to the invention.

FIG. 6 depicts a front view of another alternative embodiment of a part of an interferometer system, in accordance with an embodiment of the present invention. Herein, 70, 73*a* and 73*b* denote three similar sets of beams for measuring displacement in a certain direction, or for carrying out a three-point measurement, and so on, as desired and e.g. as described above. 71 again denotes a set of beams to be used as also described above, e.g. carrying out a differential measurement in Z direction.

Note that the three similar beams 70, 73*a*, 73*b* are arranged symmetrically, and at a distance from the set 71, such that the separate beams of 71 do not enter a volume consisting of the circumscribed polygon around the total set of beams consisting of the sets 70, 73*a* and 73*b*. In other words, when the face 56*a* of the prism 56 would be extended and would cut the polarizing beam-splitter in two parts, then one part would contain the beams of set 71, and the other part would contain the three similar sets 70, 73*a* and 73*b*. In this way, any negative influence of the beams of set 71 may be kept away from the other three sets. In particular, flows of air or other gasses which are used to condition the optical paths of the three sets may flow freely, unimpeded by beams 71. This will be elucidated with reference to the FIG. 7.

Figure 7:
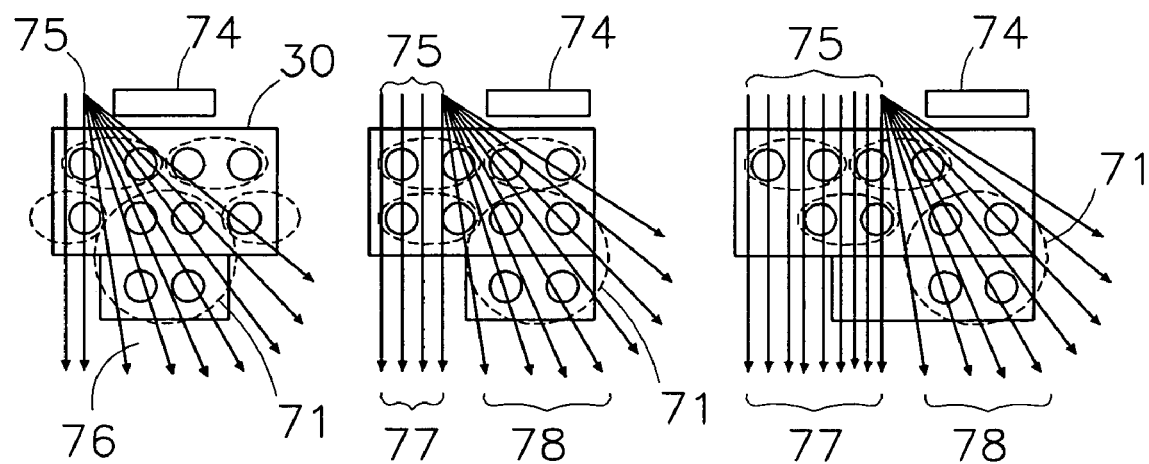
FIG. 7 shows front views of three different embodiments of a part of an interferometer system according to the invention, with conditioned air flows.

FIG. 7 shows front views of three different embodiments of a part of an interferometer system, with conditioned air flows, in accordance with an embodiment of the present invention. The leftmost embodiment shows the embodiment according to FIG. 5, but note that 74 does now denote not the retro-reflector but a Z reference mirror (see FIG. 8).

Furthermore 76 denotes a flow of conditioned air, emanating from an flow origin 75.

Such air flow is desirable because it ensures that the optical properties of the medium in the space through which the beams pass are well known and as constant as is possible. Furthermore, the air flow has a cooling action on the object(s) when being illuminated in e.g. a lithographic system.

In the leftmost embodiment, the flow origin is (point-like), and hence the flow 76 is (fan)-like. This is caused by the presence of the Z reference mirror 74, which blocks a favorable homogenous vertical air flow. Hence the speed of the air, etc. is not constant in the total volume which is flushed by the flow, and the accuracy of the measurement may be impairs, albeit that the measurement arrangement itself is highly symmetrical.

In the embodiment in the middle, which corresponds to the arrangement of FIG. 4*b*, but mirrored, the flow origin 75 is much wider. Hence, the air flow along the left-hand side of the arrangement comprises an almost laminar flow 77, and has desirable constant properties. This is achieved without increasing the volume of the polarizing beam-splitter 30. Still, the air flow along the beams in the right-hand side of the arrangement is a non-homogeneous flow 78.

In the rightmost embodiment, corresponding to the arrangement of FIG. 6, only the air flow 78 along the set of beams 71 is fan-like, while the air flow 77 along all other beams is laminar. This arrangement offers the best possible air conditioning, albeit at the cost of a somewhat increased volume of the beam-splitter 30.

Note that it is not possible in these types of arrangement to obtain a completely laminar flow in the vertical direction, because of the presence of the Z reference mirror 74. An air flow from the side would be an option in certain apparatus, although in present day lithographic apparatus this offers some undesirable disadvantages. Furthermore, the heat flow, which is also to be controlled by the air flow, will be in a vertical direction.

Figure 8A:
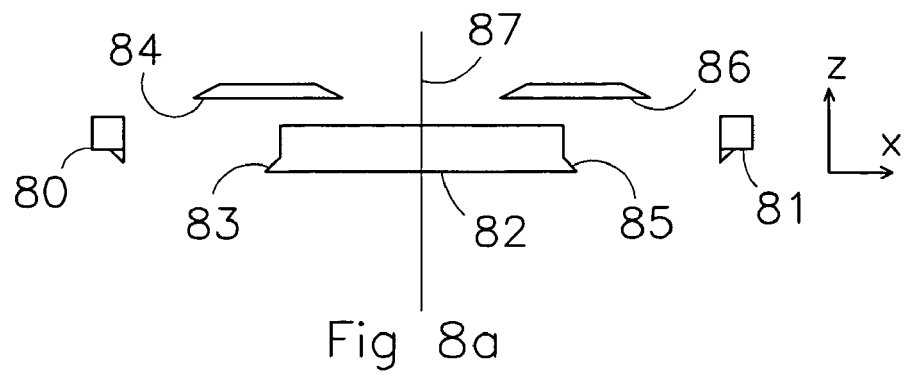
FIG. 8 schematically shows a cross-sectional view of another arrangement of an interferometer system according to the invention.
Figure 8B:
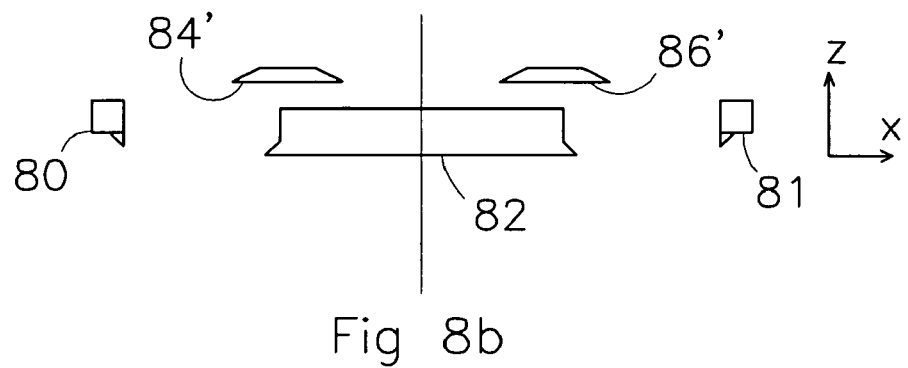

FIG. 8 schematically shows a cross-sectional view of another arrangement of an interferometer system, in accordance with an embodiment of the present invention. In FIGS. 8, 80 and 81 denote two beam-splitter blocks, at least one of which is arranged according to the invention. An object, the displacement of which is to be determined, is denoted by 82. It comprises a first 45° mirror 83 and a second 45° mirror 85. Above the object 82, there are two reference mirrors 84 and 86. A symmetry axis is denoted by 87.

At least one of the beam-splitter blocks 80 and 81 comprises a combined differential plane mirror and plane mirror interferometer system according to the invention, e.g. for X and Z displacement, and preferably with a three point X measurement. The mirrors 83 and 85 serve to direct measuring beams (not shown) towards their respective reference mirrors 84 and 86. Other measuring directions, and the appropriate mirrors are not shown for clarity.

The object 82 may be moved in the X direction with an amplitude about equal to the dimension of the reference mirrors 84 and 86 as measured in the X direction. Note that in this case it is possible to omit one of the two interferometer systems, since they are, in principle, redundant with respect to each other. However, having two such interferometer systems offers the possibility of double checking measurements. It also offers more precise measurements, since interferometer measurements are relatively more precise when long paths are involved in the measuring, with the effect that angles and tilts are determined very precisely.

Note that, generally, it is advantageous to use an interferometer system according to the invention for measuring displacements in the other directions, especially when the number of "level" in which the measurement beams are arranged is decreased. As discussed in connection with e.g. the embodiment of FIGS. 4*a* and 5*b*, it is possible to limit this number of levels to e.g. two, although this is not necessary. Such a low number of levels ensures that the corresponding mirror (not shown) on the object 82 may have a reduced size, or generally that the object 82 may have a reduced size in e.g. the Z direction. This offers the advantage of an object with less material, and hence a lesser weight and lower price.

Figure 9:
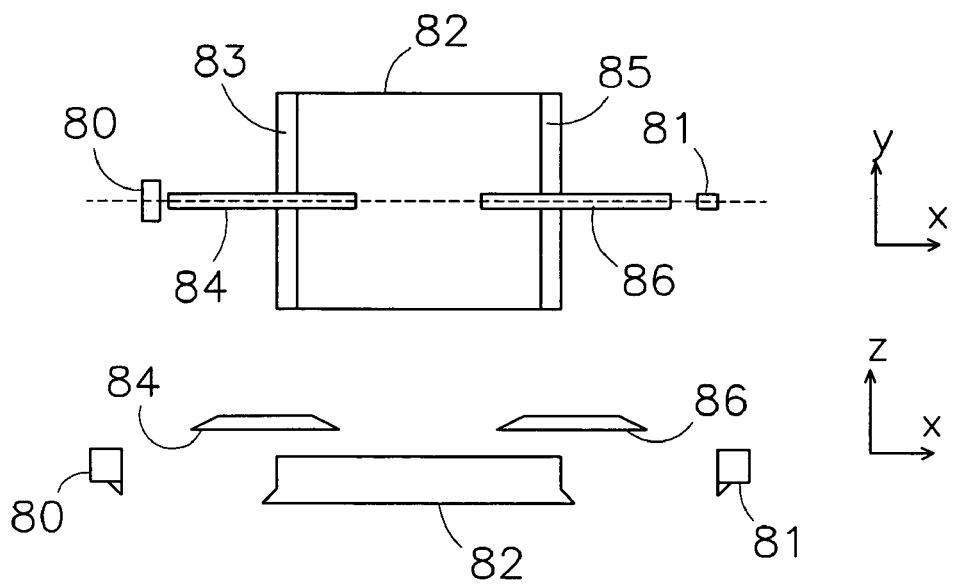

FIG. 9 depicts a top view and a cross-sectional view of the embodiment according to FIG. 8*a*. The dashed line is an axis of symmetry for the Y direction. It can be seen that the beam-splitter blocks 80 and 81 need not be the same. Here, the block 81 comprises e.g. a combination of just one measuring beam for the X direction, and one beam for the Z direction, while beam-splitter block 80 comprises a full set of one measuring beam for the Z direction and three measuring beams for the X direction. Of course, any other desired combination of measuring beams is also possible for either beam-splitter block 80, 81.

The beam-splitter block arrangement as shown in FIG. 9 is not only symmetrical in itself, such as for example the arrangements according to FIGS. 4*a* and 5*a*, but the position of both beam-splitter blocks 80, 81 is also symmetrical with respect to the axis of symmetry, shown in a dashed line. This offers certain advantages as to the overall precision of the measurements. However, it may be advantageous to allow asymmetrical arrangements, not only of the beam-splitter blocks, but also of the position of the beam-splitter blocks with respect to the axis of symmetry for the Y direction. For example, selection of a beam-splitter block arrangement according to FIG. 6 allows an improved flow of conditioned air, as discussed above.

One of the advantageous issues in connection with the present invention is the versatility that it allows in respect of the design of the optical elements of an interferometer system. By combining the two principles of absolute plane mirror interferometry and differential plane mirror interferometry into one beam-splitter block costs may be saved, while it allows many different arrangements of beams to be used in the measurement process. Some advantageous embodiments are shown, relating to e.g. improved conditioned air flows. Nevertheless, many other advantageous embodiments may be contemplated by the person skilled in the art, without departing from the scope of the invention.

Whilst specific embodiments of the invention have been described above, it will be appreciated that the invention may be practiced otherwise than as described. The embodiments described above may, instead, be implemented with features of the other described embodiments.

As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims. Finally, it is noted that the term directions in this description can comprise linear (along a certain axis) and/or rotational directions (around a certain axis such as for example a tilt movement).

What is claimed is:

1. An interferometer system for measuring displacement of an object in a plane substantially parallel to a two dimensional plane, said interferometer system comprising:
   a plane mirror interferometer system;
   a differential plane mirror interferometer system;
   a beam-splitter configured to split a radiation beam associated with said plane mirror interferometer system and a radiation beam associated with said differential plane mirror interferometer system into respective measuring beams and respective reference beams, and
   a first reflector coupled to the beam-splitter, the first reflector configured to change a direction of propagation of the reference beam associated with the differential plane mirror interferometer system such that the reference beam associated with the differential plane mirror interferometer system exits the first reflector away from the beam-splitter in a substantially orthogonal direction to the reference beam associated with the plane mirror interferometer that exits the beam-splitter.

2. The interferometer system of claim 1, wherein said beam-splitter includes a transparent body having a beam-splitting surface and the first reflector which is integrally connected to said transparent body and which has a reflective surface that extends substantially parallel to the beam splitting surface.

3. The interferometer system of claim 1, wherein the interferometer system is configured to measure displacements in at least one direction.

4. The interferometer system of claim 3, wherein the interferometer system is configured to measure displacements in a first and second directions.

5. The interferometer system of claim 4, wherein the interferometer system is configured to measure displacements in a third direction.

6. An interferometer system for measuring displacement of an object in a plane substantially parallel to an XY plane, said interferometer system comprising:
   at least one measuring mirror fixedly connected to said object and comprising a plurality of measuring mirror areas;
   at least one reference mirror comprising at least one reference mirror area;
   a beam-splitter block having a beam splitting surface;
   a plurality of radiation-sensitive detectors configured to convert radiation beams reflected towards said detectors into electric measuring signals;
   wherein said beam splitting surface of the beam-splitter block is configured to split at least one first beam of a plurality of radiation beams into a first measuring beam and a first reference beam, said first reference beam only being reflected by one or more first reference mirrors located in a fixed position with respect to said beam-splitter block, said first measuring beam being reflected by a first measuring mirror area of said plurality of measuring mirror areas,
   wherein said beam splitting surface of the beam-splitter block is configured to split at least one second beam of said plurality of radiation beams into a second measuring beam and a second reference beam, said second measuring beam being reflected by a second measuring mirror area of said plurality of measuring mirror areas, and said second reference beam being reflected by a first reflector that is fixedly positioned with respect to said beam-splitter block and by at least one third mirror area of said plurality of measuring mirror areas, which is movable with respect to said beam-splitter block,
   wherein the second reference beam associated with the at least one second beam exits the first reflector away from the beam-splitter block in a substantially orthogonal direction to the first reference beam associated with the at least one first beam that exits the beam-splitter block.

7. The interferometer system of claim 6, wherein said at least one third mirror area of said plurality of measuring mirror areas comprises a third measuring mirror area fixed to said object.

8. The interferometer system of claim 6, wherein said at least one third mirror area of said plurality of measuring mirror areas comprises a second reflector fixed to said object and a second reference mirror area located in a fixed position with respect to said beam-splitter block, wherein said second reflector is arranged to direct said second reference beam towards said second reference mirror area.

9. The interferometer system of claim 6, wherein the at least one third mirror area of said plurality of measuring mirror areas comprises a fourth mirror area of said plurality of measuring mirror areas which is fixed to a second object, which is movable with respect to the beam-splitter block.

10. The interferometer system of claim 6, wherein said plurality of radiation beams comprises at least three first radiation beams occupying more than one plane and the at least one second radiation beam in a position between two of the at least three first radiation beams.

11. The interferometer system of claim 6, wherein said plurality of radiation beams comprises at least three first radiation beams occupying more than one plane and at least one second radiation beam in a position outside a polygon volume formed by connecting respective first reference beams and respective first measuring beams.

12. The interferometer system of claim 6, wherein said beam-splitter block comprises a transparent body having the beam-splitting surface and the first reflector which is integrally connected to said transparent body and which has a reflective surface that extends substantially parallel to the beam splitting surface.

13. The interferometer system of claim 6, wherein the interferometer system is configured to measure displacements in at least one direction.

14. The interferometer system of claim 13, wherein the interferometer system is configured to measure displacements in a first and second directions.

15. The interferometer system of claim 14, wherein the interferometer system is configured to measure displacements in a third direction.

16. A lithographic apparatus comprising:
   a support structure configured to support a patterning device that serves to impart a beam of radiation with a pattern in its cross-section;
   a substrate holder configured to hold a substrate;
   a projection system configured to project said patterned beam onto a target portion of the substrate; and
   an interferometer system configured to measure displacement of at least one of said patterning device and said substrate, wherein said interferometer system comprises,
      a plane mirror interferometer system;
      a differential plane mirror interferometer system;
      a beam splitter, configured to split a beam associated with said plane mirror interferometer system and a beam associated with said differential plane mirror interferometer system into respective measuring beams and respective reference beams; and
      a reflector coupled to the beam-splitter, the reflector configured to change the direction of propagation of the reference beam associated with the differential plane mirror interferometer system such that the reference beam associated with the differential plane mirror interferometer system exits the reflector away from the beam-splitter in a substantially orthogonal direction to the reference beam associated with the plane mirror interferometer system that exits the beam-splitter.

17. The apparatus of claim 16, wherein the interferometer system is configured to measure displacements in at least one direction.

18. The apparatus of claim 17, wherein the interferometer system is configured to measure displacements in a first and second directions.

19. The apparatus of claim 18, wherein the interferometer system is configured to measure displacements in a third direction.

20. A lithographic apparatus comprising:
   a support structure configured to support a patterning device that serves to impart a beam of radiation with a pattern in its cross-section;

a substrate holder configured to hold a substrate;

a projection system configured to project said patterned beam onto a target portion of the substrate; and an interferometer system configured to measure displacement of at least one of said patterning device and said substrate, wherein said interferometer system comprises, at least one measuring mirror fixedly connected to at least one of said patterning device and said substrate, said at least one measuring mirror comprising a plurality of measuring mirror areas;

at least one reference mirror comprising at least one reference mirror area;

a beam generator configured to generate a plurality of radiation beams, said beam generator comprising a beam-splitter block having a beam splitting surface; and a plurality of radiation-sensitive detectors configured to convert radiation beams reflected towards said detectors into electric measuring signals, wherein said beam splitting surface of the beam-splitter block is configured to split at least one first beam of said plurality of radiation beams into a first measuring beam and a first reference beam, said first reference beam only being reflected by one or more first reference mirrors located in a fixed position with respect to said beam-splitter block, said first measuring beam being reflected by a first measuring mirror area of said plurality of measuring mirror areas, wherein said beam splitting surface of the beam-splitter block is configured to split at least one second beam of said plurality of radiation beams into a second measuring beam and a second reference beam, said second measuring beam being reflected by a second measuring mirror area of said plurality of measuring mirror areas, and said second reference beam being reflected by a first reflector that is fixedly positioned with respect to said beam-splitter block and by at least one third mirror area of said plurality of measuring mirror areas, which is movable with respect to said beam-splitter block, wherein the second reference beam associated with the at least one second beam exits the first reflector away from the beam-splitter block in a substantially orthogonal direction to the first reference beam associated with the at least one first beam that exits the beam-splitter block.

21. The apparatus of claim 20, wherein the interferometer system is configured to measure displacements in at least one direction.

22. The apparatus of claim 21, wherein the interferometer system is configured to measure displacements in a first and second directions.

23. The apparatus of claim 22, wherein the interferometer system is configured to measure displacements in a third direction.

24. The apparatus of claim 20, wherein said at least one third mirror area of said plurality of measuring mirror areas comprises a third measuring mirror area fixed to said object.

25. The apparatus of claim 20, wherein said at least one third mirror area of said plurality of measuring mirror areas comprises a second reflector fixed to said object and a second reference mirror area located in a fixed position with respect to said beam-splitter block, wherein said second reflector is arranged to direct said second reference beam towards said second reference mirror area.

26. The apparatus of claim 20, wherein the at least one third mirror area of said plurality of measuring mirror areas comprises a fourth mirror area of said plurality of measuring mirror areas which is fixed to a second object, which is movable with respect to the beam-splitter block.

27. The apparatus of claim 20, wherein said plurality of radiation beams comprises at least three first radiation beams occupying more than one plane and at least one second radiation beam in a position between two of said at least three first radiation beams.

28. The apparatus of claim 20, wherein said plurality of radiation beams comprises at least three first radiation beams occupying more than one plane and at least one second radiation beam in a position outside a polygon volume formed by connecting respective first reference beams and respective first measuring beams.

29. The apparatus of claim 20, wherein said beam-splitter block comprises a transparent body having the beam-splitting surface and the first reflector which is integrally connected to said transparent body and which has a reflective surface that extends substantially parallel to the beam splitting surface.

30. A device manufacturing method comprising:

using a patterning device to impart beam of radiation with a pattern in its cross-section; and projecting said patterned beam of radiation onto a target portion of a substrate, wherein a position of at least one of said patterning device or said substrate is determined by an interferometer system, which is configured to operate by, providing at least one measuring mirror fixedly connected to at least one of said patterning device and said substrate, said at least one measuring mirror comprising a plurality of measuring mirror areas, providing at least one reference mirror comprising at least one reference mirror area, providing a plurality of radiation-sensitive detectors, splitting at least a first beam of said plurality of beams, via a beam splitter block having a beam splitting surface, into a first measuring beam and a first reference beam, said first reference beam only being reflected by one or more first reference mirrors located in a fixed position with respect to said beam-splitter block, said first measuring beam being reflected by a first measuring mirror area of said plurality of measuring mirror areas, and splitting at least a second beam of said plurality of beams, via said beam splitting surface, into a second measuring beam and a second reference beam, said second measuring beam being reflected by a second measuring mirror area of said plurality of measuring mirror areas, and said second reference beam being reflected in a substantially orthogonal direction with respect to the first reference beam and away from the beam-splitter block by a first reflector that is fixedly positioned with respect to said beam-splitter block and by at least one third mirror area of said plurality of measuring mirror area, which is movable with respect to said beam-splitter block, and converting beams which are reflected towards said detectors into electrical measuring signals.

31. The method of claim 30, wherein the interferometer system is configured to measure displacements in at least one direction.

32. The method of claim 31, wherein the interferometer system is configured to measure displacements in a first and second directions.

33. The apparatus of claim 32, wherein the interferometer system is configured to measure displacements in a third direction.

34. The method of claim 30, wherein said at least one third mirror area of said plurality of measuring mirror areas of said interferometer system comprises a third measuring mirror area fixed to said object.

35. The method of claim 30, wherein said at least one third mirror area of said plurality of measuring mirror areas of said interferometer system comprises a second reflector fixed to said object and a second reference mirror area located in a fixed position with respect to said beam-splitter block, wherein said second reflector is arranged to direct said second reference beam towards said second reference mirror area.

36. The method of claim 30, wherein said at least one third mirror area of said plurality of measuring mirror areas of said interferometer system comprises a fourth mirror area which is fixed to a second object, which is movable with respect to the beam-splitter block.

37. The method of claim 30, wherein said plurality of beams of said interferometer system comprises at least three first radiation beams occupying more than one plane and at least one second radiation beam in a position between two of said at least three first radiation beams.

38. The method of claim 30, wherein said plurality of beams of said interferometer system comprises at least three first beams occupying more than one plane and at least one second beam in a position outside a polygonal volume formed by connecting respective first reference beams and respective first measuring beams.

39. The method of claim 30, wherein said beam-splitter block of said interferometer system comprises a transparent body having the beam-splitting surface and the first reflector which is integrally connected to said transparent body and which has a reflective surface that extends substantially parallel to the beam splitting surface.

* * * * *

UNITED STATES PATENT AND TRADEMARK OFFICE
CERTIFICATE OF CORRECTION

PATENT NO.        : 7,474,409 B2                                    Page 1 of 1
APPLICATION NO. : 10/995545
DATED             : January 6, 2009
INVENTOR(S)       : Eussen et al.

It is certified that error appears in the above-identified patent and that said Letters Patent is hereby corrected as shown below:

Column 22
Line 40 please replace "splitter, configured" with --splitter configured--.

Signed and Sealed this

Thirty-first Day of March, 2009

JOHN DOLL
*Acting Director of the United States Patent and Trademark Office*